US006674171B2

(12) United States Patent
Yamaguchi

(10) Patent No.: US 6,674,171 B2
(45) Date of Patent: Jan. 6, 2004

(54) SEMICONDUCTOR DEVICE WITH A LOW RESISTANCE WIRING

(75) Inventor: Sumio Yamaguchi, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/208,837

(22) Filed: Aug. 1, 2002

(65) Prior Publication Data
US 2003/0137049 A1 Jul. 24, 2003

(30) Foreign Application Priority Data

Jan. 24, 2002 (JP) ........................ 2002-015496

(51) Int. Cl.[7] ................ H01L 23/48; H01L 23/52
(52) U.S. Cl. .............. 257/774; 257/741; 257/751; 257/753; 257/758; 257/761; 257/762; 257/764; 438/622; 438/625; 438/627; 438/638; 438/687
(58) Field of Search ................ 257/775, 774, 257/773, 741, 750, 751, 752, 753, 758, 759, 760, 761, 762, 763, 764, 765, 766; 438/687, 625, 626, 627–629, 637, 636

(56) References Cited
U.S. PATENT DOCUMENTS 6,153,519 A * 11/2000 Jain et al. ................ 438/681

6,451,181 B1 * 9/2002 Denning et al. ........ 204/192.17
2002/0180044 A1 * 12/2002 Lu et al. ..................... 257/751

FOREIGN PATENT DOCUMENTS

JP          7-226387          8/1995

* cited by examiner

*Primary Examiner*—Wael Fahmy
*Assistant Examiner*—Thanhha S Pham
(74) *Attorney, Agent, or Firm*—McDermott, Will & Emery

(57) ABSTRACT

An impurity region is formed on the surface of a semiconductor substrate. An insulating layer is provided on the semiconductor substrate to cover the impurity region. A trench for defining a wiring layer is provided on the surface of the insulating layer. A connection hole is provided in the insulating layer for connecting the trench and the impurity region with each other. A conductive layer made of a high melting point metal or a compound thereof is embedded in the connection hole. A copper wire is formed in the trench to be connected to the conductive layer. According to the present invention, a semiconductor device improved to be capable of implementing an excellent wiring circuit and providing a highly integrated semiconductor circuit is obtained.

5 Claims, 4 Drawing Sheets

SEMICONDUCTOR DEVICE WITH A LOW RESISTANCE WIRING

BACKGROUND OF THE INVENTION

1. Field of the Invention

The present invention generally relates to a semiconductor device, and more specifically, it relates to a semiconductor device improved to be capable of implementing an excellent wiring circuit and obtaining a highly integrated semiconductor circuit.

2. Description of the Background Art

Following refinement of a semiconductor device, a wire having low resistance and high reliability must be formed in a wiring step. Copper (Cu) is listed as a material satisfying such requirement for the wire. However, copper diffuses into a conductive impurity region formed on a semiconductor substrate from a copper wire connected to the impurity region, to deteriorate diffused junction. Thus, it is difficult to form an excellent impurity region and an excellent wire including a desired connection hole.

A conventional method of fabricating a semiconductor device is now described with reference to FIG. 6.

Referring to FIG. 6, an impurity region 102 is selectively formed on the surface of a semiconductor substrate 101. An insulating layer 103 of silicon oxide is formed by CVD (chemical vapor deposition) in a thickness of 500 to 1500 nm, for example, to cover the surface of the semiconductor substrate 101. Thereafter the insulating layer 103 is patterned by photolithography and etching, for forming a connection hole 104 vertically passing through the insulating layer 103. Further, a trench 105 for defining a wiring layer is formed in the surface of the insulating layer 103 by photolithography and etching, to cover the upper portion of the connection hole 104.

Then, the inner wall surface and the bottom surface of the trench 105 as well as the inner wall surface and the bottom surface of the connection hole 104 are covered with a barrier metal film 106 by PVD (physical vapor deposition) or the like. Thereafter a copper wire 107 serving as a conductive film is embedded in the trench 106 and the connection hole 104.

Then, excess parts of the copper wire 107 and the barrier metal film 106 other than those located on the trench 106 are removed from the upper surface of the insulating layer 103. Thus, the copper wire 107 is completed.

Another conventional method of fabricating a semiconductor device is described with reference to FIG. 7.

A semiconductor substrate 101 selectively formed with an impurity region 102 is prepared. An insulating layer 103 of silicon oxide is formed by CVD in a thickness of about 500 to 1500 nm, for example, to cover the surface of the semiconductor substrate 101. Thereafter the insulating layer 103 is patterned by photolithography and etching for forming a connection hole 104 vertically passing through the insulating layer 103. Then, a barrier metal film 108 is formed on the inner wall surface and the bottom surface of the connection hole 104 by CVD or PVD, and a tungsten film 109 is thereafter embedded in the connection hole 104 by CVD. Then, excess parts of the tungsten film 109 and the barrier metal film 108 are removed from the upper surface of the insulating layer 103 by dry etching or CMP. Thus, a plug filled up with tungsten is formed.

Then, a silicon oxide film 110 is formed on the insulating layer 103 in a thickness of 500 to 1500 nm, for example.

Thereafter the silicon oxide film 110 is patterned by photolithography and etching for forming a trench 111 for defining a wiring layer to expose the connection hole 104.

Then, a barrier metal film 112 is formed on the overall surface of the semiconductor substrate 101 by PVD, to cover the inner wall surface and the bottom surface of the trench 111. Thereafter a copper wire 113 serving as a conductive film is embedded in the trench 111 by plating. Then, excess parts of the copper wire 113 and the barrier metal film 112 are removed from the upper surface of the silicon oxide film 110 by dry etching or CMP. Thus, the copper wire 113 is completed.

The conventional semiconductor device is fabricated in the aforementioned manner.

In the semiconductor device shown in FIG. 6, however, it is difficult to form the barrier metal film 106 in a thickness sufficient for preventing diffusion of copper from the copper wire 107. Therefore, copper disadvantageously diffuses into the impurity region 102 from the copper wire 107 to deteriorate diffused junction between the impurity region 102 and the semiconductor substrate 101.

The semiconductor device shown in FIG. 7 has been proposed in order to solve this problem. According to this prior art, a tungsten plug can be formed in the connection hole 104 while the barrier metal film 112 having a sufficient thickness can be formed on the bottom of the connection hole 111, whereby the copper wire 107 can be prevented from diffusion of copper. However, this method requires steps of forming the barrier metal film 108 and forming the tungsten film 109 as well as a CMP removal step for removing the excess parts of the barrier metal film 108 and the tungsten film 109 other than those located on the connection hole 104 from the upper surface of the silicon oxide film 103. In this method, therefore, the number of process steps is increased beyond the number of steps in the method of fabricating the semiconductor device shown in FIG. 6, to disadvantageously reduce productivity.

SUMMARY OF THE INVENTION

The present invention has been proposed in order to solve the aforementioned problems, and an object thereof is to provide a semiconductor device improved to be capable of efficiently preventing diffusion of copper from a copper wire.

Another object of the present invention is to provide a semiconductor device not reduced in productivity.

A semiconductor device according to a first aspect of the present invention comprises a semiconductor substrate. An impurity region is formed on the surface of the aforementioned semiconductor substrate. An insulating layer is provided on the aforementioned semiconductor substrate to cover the aforementioned impurity region. A trench for defining a wiring layer is provided on the surface of the aforementioned insulating layer. A connection hole connecting the aforementioned trench and the aforementioned impurity region with each other is provided in the aforementioned insulating layer. A conductive layer made of a high melting point metal and/or a compound thereof is embedded in the aforementioned connection hole. A wiring layer is formed in the aforementioned trench to be electrically connected to the aforementioned conductive layer.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

First Embodiment

Figure 1:
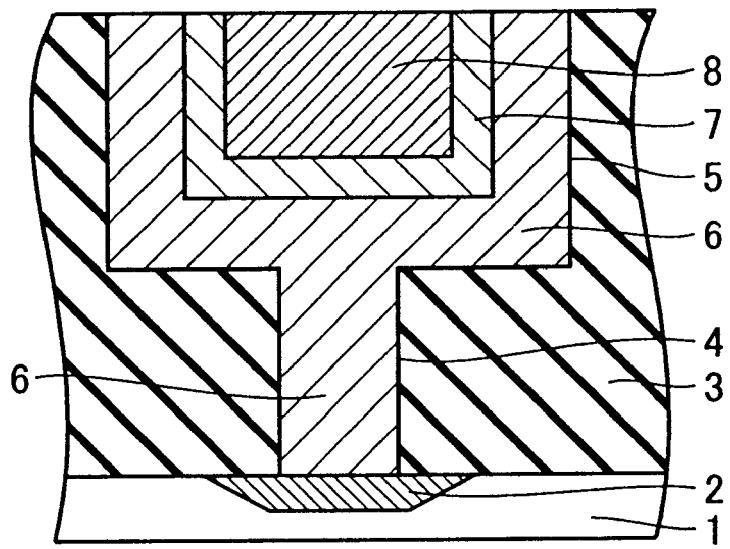
FIGS. 1 and 2 are sectional views of semiconductor devices according to first and second embodiments of the present invention respectively.

FIG. 1 is a sectional view of a semiconductor device according to a first embodiment of the present invention.

Referring to FIG. 1, an impurity region 2 is formed on the surface of a semiconductor substrate 1. An insulating layer 3 is provided on the semiconductor substrate 1 to cover the impurity region 2. A trench 5 for defining a wiring layer is provided on the surface of the insulating layer (silicon oxide film) 3. A connection hole 4 connecting the trench 5 and the impurity region 2 with each other is provided in the insulating layer 3. A barrier metal film 6 serving as a first conductive layer made of a high melting point metal and/or a compound thereof is provided in the connection hole 4. The side wall surface and the bottom surface of the trench 5 are covered with the barrier metal film 6 made of the high melting point metal and/or the compound thereof. A barrier metal film 7 serving as a second conductive layer and a copper wire 8 are formed on the barrier metal film 6.

A method of fabricating the semiconductor device according to the first embodiment is now specifically described.

The insulating layer 3 of silicon oxide is formed on the semiconductor substrate 1 formed with the impurity region 2 by CVD in a thickness of 500 to 1500 nm, for example. Thereafter the insulating layer 3 is patterned by photolithography and etching for forming the connection hole 4 vertically passing through the insulating layer 3. The trench 5 for defining the wiring layer is formed on the surface of the insulating layer 3 to cover the upper portion of the connection hole 4.

The barrier metal film 6 is embedded in the connection hole 4 and further formed on the side wall surface and the bottom surface of the trench 5. The barrier metal film 6 is formed by a film of titanium (Ti)/titanium nitride (TiN), for example.

Then, the surface of the barrier metal film 6 is covered with the barrier metal film 7. The barrier metal film 7 is formed by a film of tantalum nitride (TaN) or a composite film of tantalum nitride and tantalum, for example. The copper wire 8 serving as a conductive film is formed to cover the barrier metal film 7.

According to this embodiment, the connection hole 4 can be filled up with a high melting point metal or a compound thereof while the barrier metal films 6 and 7 of sufficient thicknesses can be formed on the bottom of the connection hole 4, whereby copper can be sufficiently inhibited from diffusing into the impurity region 2 from the copper wire 8. Thus, the impurity region 2 and the wire 8 including the desired connection hole 4 can be formed in excellent states.

While the barrier metal film 6 is made of titanium/titanium nitride and the barrier metal film 7 is made of tantalum nitride in this embodiment, the present invention is not restricted to this but the barrier metal films 6 and 7 may alternatively be made of other high melting point metal(s) and/or compound(s) thereof for attaining a similar effect.

Second Embodiment

Figure 2:
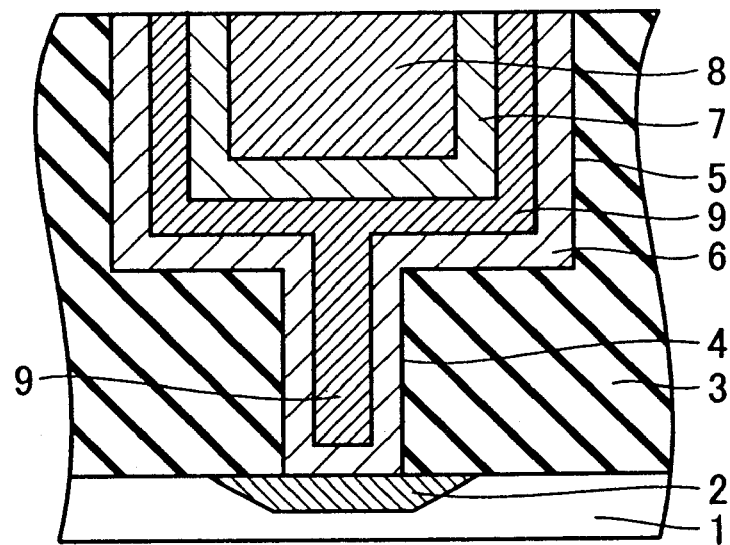

FIG. 2 is a sectional view of a semiconductor device according to a second embodiment of the present invention.

The semiconductor device according to the second embodiment is identical to the semiconductor device according to the first embodiment except the following point. Therefore, parts identical or corresponding to those in FIG. 1 are denoted by the same reference numerals, and redundant description is not repeated.

According to this embodiment, the inner wall surface and the bottom surface of a connection hole 4 are covered with a barrier metal film 6, having metal diffusion resistance, made of a high melting point metal and/or a compound thereof. The barrier metal film 6 also covers the inner wall surface and the bottom surface of a trench 5. A barrier metal film 9 of a high melting point metal and/or a compound thereof having a lower stress property than the barrier metal film 6 is embedded in the connection hole 4. The barrier metal film 9 covers the inner wall surface and the bottom surface of the trench 5 through the barrier metal film 6. Still another barrier metal film 7 and a copper film 8 are formed on the barrier metal film 9 in the trench 5. The barrier metal film 9 is made of titanium nitride (TiN) having a low stress property. The barrier metal films 6 and 9 form a plug. The plug formed in the connection hole 4 is hardly cracked due to titanium nitride having low stress property forming the barrier metal film 9.

As hereinafter described, the barrier metal film 6 is made of CVD-TiN prepared under a high temperature to have a high barrier property and low resistance, while the barrier metal film 9 is made of CVD-TiN prepared under a low temperature to have a low stress property.

Third Embodiment

Another method of fabricating the semiconductor device shown in FIG. 1 is now described.

Figure 3:
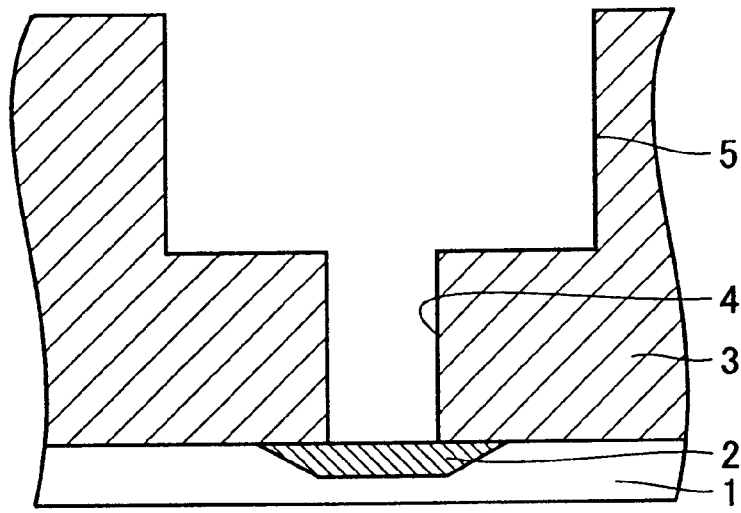
FIGS. 3 to 5 are sectional views showing first to third steps of a method of fabricating the semiconductor device shown in FIG. 1.

Referring to FIG. 3, an insulating layer 3 of silicon oxide is formed on a semiconductor substrate 1 selectively formed with an impurity region 2 by CVD in a thickness of 500 to 1500 nm, for example. Thereafter the insulating layer 3 is patterned by photolithography and etching for forming a connection hole 4. A trench 5 for defining a wring layer is formed by photolithography and etching.

Figure 4:
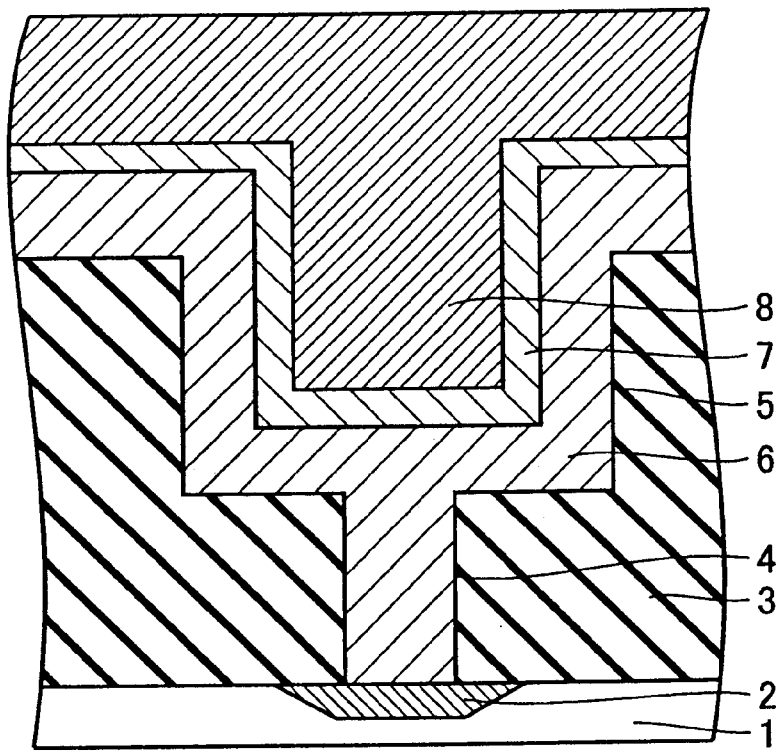

Referring to FIG. 4, a barrier metal film 6 is formed on the overall surface of the semiconductor substrate 1 by CVD. The barrier metal film 6 is formed on the insulating layer 3 to be embedded in the connection hole 4 while covering the side wall surface and the bottom surface of the trench 5. The barrier metal film 6 is formed by a film of titanium (Ti)/titanium nitride (TiN), for example. Titanium (Ti) is prepared by reducing titanium tetrachloride ($TiCl_4$) with hydrogen ($H_2$) and plasma assisted by a high frequency at a temperature of 650° C., for example. Titanium nitride (TiN) is prepared by reducing titanium tetrachloride with ammonia ($NH_3$) at 650° C., for example. The aforementioned titanium reduces a surface oxide film of the impurity region 2, whereby the impurity region 2 is excellently connected with the titanium nitride through a conductive film.

Then, a barrier metal film 7 is formed on the overall surface of the semiconductor substrate 1 by PVD or CVD. The barrier metal film 7 is formed to cover the inner wall surface of the trench 5 through the barrier metal film 6. The barrier metal film 7 is formed by a composite film combining tantalum nitride with tantalum (Ta), for example. In PVD of tantalum nitride, for example, tantalum atoms are emitted from a tantalum target by Ar discharge, to react with nitrogen and form tantalum nitride.

Further, a thin film of copper necessary for nucleation of copper is formed by PVD in general. Then, a copper wire 8 of a conductive film is formed by plating, to cover the barrier metal film 7.

Figure 5:
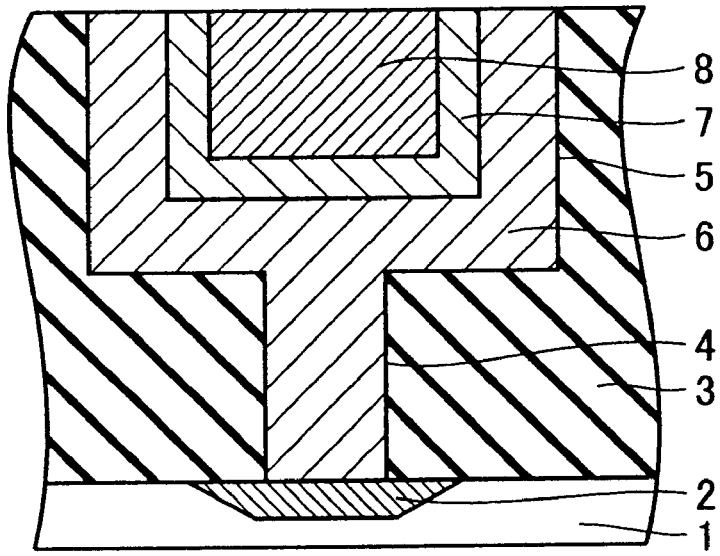
Figure 6:
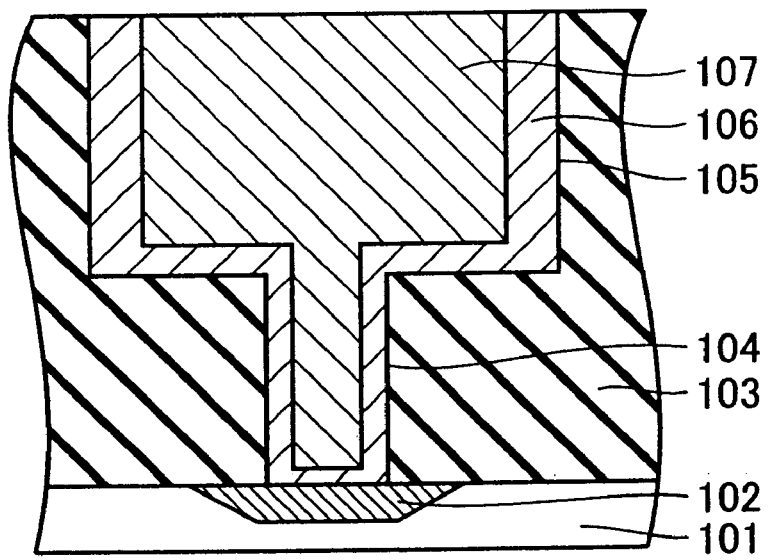
FIGS. 6 and 7 are sectional views showing conventional semiconductor devices respectively.
Figure 7:
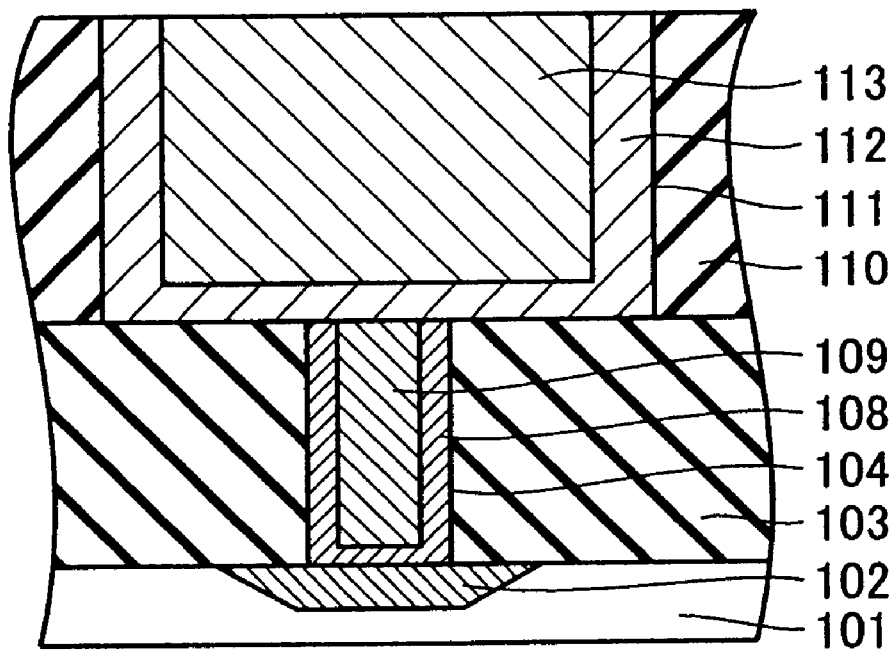

Referring to FIG. 5, excess parts of the copper wire 8 and the barrier metal films 6 and 7 other than those located on the trench 5 are removed from the upper surface of the insulating layer 3 by CMP or dry etching. Thus, the semiconductor device including the impurity region 2 and the copper wire 8 having excellent conductivity is formed.

Fourth Embodiment

The titanium nitride forming the barrier metal film 6 in the semiconductor device according to the first embodiment is prepared at 650° C., for example, to have a high barrier property and low resistance. However, this film of titanium nitride has extremely large stress. The stress of such a titanium nitride film is about 1 to 2 GPa. If the thickness the titanium nitride film filling up the connection hole 4 is increased, therefore, the film is disadvantageously cracked due to large stress. If the connection hole 4 is about 0.1 $\mu$m in diameter, for example, the titanium nitride film cannot be embedded therein in an excellent state. Thus, the impurity region 2 and the copper wire 8 cannot be sufficiently electrically connected with each other through the connection hole 4 in this case.

Another method of fabricating the semiconductor device shown in FIG. 2 proposed for preventing the aforementioned disadvantage is now described. Referring again to FIG. 2, a barrier metal film 6 including a high stress film of titanium nitride is formed on the side wall surfaces of a connection hole 4 and a trench 5 for defining a wiring layer. At this time, the connection hole 4 is not completely filled up with the barrier metal film 6. A barrier metal film 9 consisting of titanium nitride having low stress of about 0.5 GPa completely fills up the connection hole 4.

The barrier metal film 9 having low stress is formed by reducing titanium tetrachloride (TiCl$_4$) with ammonia (NH$_3$) at a temperature of 500° C., for example, lower than the aforementioned temperature of 650° C.

Thus, the impurity region 2 and the copper wire 8 can be excellently electrically connected with each other through the connection hole 4 without cracking the barrier metal films 6 and 9 suppressed in stress.

Fifth Embodiment

In a semiconductor device according to a fifth embodiment of the present invention, processes of forming barrier metal films 6 and 9 are carried out in the same multi-chamber type apparatus. Thus, operation is simplified.

Sixth Embodiment

A semiconductor device according to a sixth embodiment includes both of the wiring structures shown in FIGS. 1 and 2. The wiring structure shown in FIG. 1 is formed on a portion where the diameter of a connection hole is small and the wiring structure shown in FIG. 2 is formed on a portion where the diameter of the connection hole is large. Thus, both portions can be prevented from cracking.

According to the present invention, as hereinabove described, an excellent wiring circuit can be implemented for obtaining a highly integrated semiconductor circuit. Also when a connection hole is large, an excellent wiring circuit can be implemented without cracking barrier metal films.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:

a semiconductor substrate;

an impurity region formed on the surface of said semiconductor substrate;

an insulating layer provided on said semiconductor substrate to cover said impurity region;

a trench provided in the surface of said insulating layer for defining a wiring layer;

a connection hole provided in said insulating layer for connecting said trench and said impurity region with each other;

a conductive layer, completely filling said connection hole, made of a high melting point metal and/or a compound thereof, said conductive layer includes: a first conductive layer, having metal diffusion resistance, made of a high melting point metal and/or a compound thereof provided on said semiconductor substrate to cover the inner wall surface and the bottom surface of said connection hole wherein said first conductive layer prevents material of said wiring layer from diffusing into said impurity region; and a second conductive layer, completely filling said connection hole to be in contact with said first conductive layer, made of a high melting point metal and/or a compound thereof to have a lower stress property than said first conductive layer; and said wiring layer formed in said trench to be electrically connected to said conductive layer.

2. The semiconductor device according to claim 1, wherein said wiring layer is made of copper.

3. The semiconductor device according to claim 1, wherein said conductive layer constitutes a conductive diffusion barrier layer which prevents material of said wiring layer from diffusing into said impurity region.

4. The semiconductor device according to claim 3, wherein said wiring layer is made of copper.

5. The semiconductor device according to claim 1, wherein said first and second conductive layers constitute conductive diffusion barrier layers which prevent material of said wiring layer from diffusing into said impurity region.

* * * * *